US010739834B2

(12) United States Patent
Katrak et al.

(10) Patent No.: US 10,739,834 B2
(45) Date of Patent: Aug. 11, 2020

(54) OPTIMIZED POWER SUPPLY ARCHITECTURE

(71) Applicant: TRW Automotive U.S. LLC, Livonia, MI (US)

(72) Inventors: Kerfegar K. Katrak, Kalamazoo, MI (US); Paul Yuska, Novi, MI (US)

(73) Assignee: TRW Automotive U.S. LLC, Livonia, MI (US)

( * ) Notice: Subject to any disclaimer, the term of this patent is extended or adjusted under 35 U.S.C. 154(b) by 0 days.

(21) Appl. No.: 15/601,579

(22) Filed: May 22, 2017

(65) Prior Publication Data
US 2017/0255241 A1 Sep. 7, 2017

Related U.S. Application Data

(63) Continuation of application No. 14/296,434, filed on Jun. 4, 2014, now abandoned.

(60) Provisional application No. 61/830,934, filed on Jun. 4, 2013.

(51) Int. Cl.
*B60R 16/03* (2006.01)
*G06F 11/30* (2006.01)
*G06F 1/26* (2006.01)
*G06F 1/28* (2006.01)
*G01R 31/40* (2020.01)

(52) U.S. Cl.
CPC ............... *G06F 1/26* (2013.01); *B60R 16/03* (2013.01); *G06F 1/28* (2013.01); *G06F 11/3058* (2013.01); *G06F 11/3089* (2013.01); *G01R 31/40* (2013.01)

(58) Field of Classification Search
CPC ........ B60R 16/03; G01R 31/40; G01R 19/00; G06F 11/3058; G06F 11/3089; G06F 1/26; G06F 1/28
USPC ............... 702/58, 60, 62, 117, 182; 324/509
See application file for complete search history.

(56) References Cited

U.S. PATENT DOCUMENTS 5,444,595 A * 8/1995 Ishikawa .............. H03K 3/0231
361/86
5,912,590 A * 6/1999 Miyano ................... H03F 3/087
330/294

(Continued)

FOREIGN PATENT DOCUMENTS

EP 2555004 A1 2/2013

OTHER PUBLICATIONS

CN Notification of the Second Office Action, Application No. 201480042821.X, dated Dec. 28, 2018.
(Continued)

*Primary Examiner* — Alexander Satanovsky
*Assistant Examiner* — Jeffrey P Aiello
(74) *Attorney, Agent, or Firm* — MacMillan, Sobanski & Todd, LLC

(57) ABSTRACT

A power supply architecture provides for the efficient distribution and failsafe monitoring of power in a microcontroller system. The power supply architecture incorporates various components with high integrity and diverse monitoring schemes that allow the associated control processors to operate with high safety standards. The various embodiments provide an integrated method or apparatus for an electronic module safety architecture which includes diversity, time and space independence for power supplies for the various microprocessors and control communication buses.

25 Claims, 9 Drawing Sheets

(56) References Cited

U.S. PATENT DOCUMENTS

| | | | |
|---|---|---|---|
| 6,002,141 A * | 12/1999 | Niigaki | H01J 1/34 257/10 |
| 6,732,285 B1 | 5/2004 | Sommer et al. | |
| 7,242,329 B2 | 7/2007 | Katak | |
| 7,392,411 B2 * | 6/2008 | Shakkarwar | G06F 1/3203 710/104 |
| 7,725,782 B2 | 5/2010 | Katrak | |
| 9,214,804 B2 * | 12/2015 | Persson | H02M 1/32 |
| 2001/0001319 A1 | 5/2001 | Beckert et al. | |
| 2003/0223162 A1 * | 12/2003 | Ausserlechner | H03F 1/523 361/42 |
| 2004/0042135 A1 | 3/2004 | Strutt et al. | |
| 2004/0145242 A1 | 7/2004 | Rodriguez et al. | |
| 2005/0140209 A1 * | 6/2005 | Fehr | H02J 1/14 307/9.1 |
| 2005/0250557 A1 | 11/2005 | Marschalkowski et al. | |
| 2006/0146467 A1 | 7/2006 | Ruan et al. | |
| 2007/0097569 A1 * | 5/2007 | Huang | H02M 1/32 361/56 |
| 2007/0174698 A1 | 7/2007 | Bailey et al. | |
| 2007/0273211 A1 * | 11/2007 | Wang | H02J 1/12 307/45 |
| 2008/0164759 A1 * | 7/2008 | Sharma | H02J 1/10 307/52 |
| 2008/0244279 A1 | 10/2008 | Godzinski et al. | |
| 2009/0089604 A1 | 4/2009 | Malik et al. | |
| 2009/0138740 A1 | 5/2009 | Fan | |
| 2009/0249090 A1 * | 10/2009 | Schmitz | G06F 1/3203 713/300 |
| 2010/0103567 A1 | 4/2010 | Saeck et al. | |
| 2010/0185336 A1 * | 7/2010 | Rovnyak | H02J 3/38 700/287 |
| 2010/0232197 A1 * | 9/2010 | Park | G06F 13/4239 365/51 |
| 2010/0332715 A1 | 12/2010 | Hadden et al. | |
| 2011/0022871 A1 | 1/2011 | Bouvier et al. | |
| 2011/0082621 A1 * | 4/2011 | Berkobin | B60L 11/1824 701/31.4 |
| 2011/0131427 A1 * | 6/2011 | Jorgenson | G06F 1/26 713/300 |
| 2011/0254457 A1 * | 10/2011 | Marent | H05B 33/0815 315/210 |
| 2012/0105051 A1 * | 5/2012 | Furtner | H03K 5/19 324/123 R |
| 2013/0066492 A1 * | 3/2013 | Holmes | B60W 20/00 701/22 |
| 2013/0113507 A1 * | 5/2013 | Danesh | G01R 21/133 324/713 |
| 2013/0294111 A1 * | 11/2013 | Persson | H02M 1/32 363/16 |
| 2013/0300308 A1 * | 11/2013 | Sadwick | H05B 33/089 315/224 |
| 2014/0223205 A1 * | 8/2014 | Muthukaruppan | G06F 1/32 713/320 |
| 2015/0078096 A1 * | 3/2015 | Kawasaki | H03K 3/35613 365/185.23 |
| 2015/0241890 A1 * | 8/2015 | Raychowdhury | G05F 1/56 713/300 |

OTHER PUBLICATIONS

PCT/US2014/040967 International Search Report and Written Opinion, dated Oct. 23, 2014.

PCT/US2014/048986 International Search Report and Written Opinion, dated Oct. 29, 2014.

* cited by examiner

OPTIMIZED POWER SUPPLY ARCHITECTURE

CROSS-REFERENCE TO RELATED APPLICATIONS

This application is a continuation of U.S. patent application Ser. No. 14/296,434, filed Jun. 4, 2014, and further claims the benefit of U.S. Provisional Application No. 61/830,934; filed Jun. 4, 2013; the disclosures of both applications are incorporated herein by reference in its entirety.

BACKGROUND OF THE INVENTION

This invention relates in general to a power supply architecture that may be used in a control system comprising one or more microprocessors and, in particular, to a power supply architecture that provides for safety monitoring of the various supply voltages associated with the power supply and/or peripheral components.

In automotive applications, the particular safety standards to which a component or system must adhere are determined by a risk classification scheme known as Automotive Safety Integrity Level (ASIL) and defined by the ISO 26262 Functional Safety for Road Vehicles standard. This classification helps define the safety requirements necessary to be in line with the ISO 26262 standard. The ASIL is established by performing a risk analysis of a potential hazard by looking at the Severity, Exposure and Controllability of the vehicle operating scenario. The safety goal for that hazard in turn carries the ASIL requirements. There are four ASILs identified by the standard: ASIL A, ASIL B, ASIL C, and ASIL D. ASIL D dictates the highest integrity requirements on the product and ASIL A the lowest.

ASIL D refers to the highest classification of initial hazard (injury risk) defined within ISO 26262 and to that standard's most stringent level of safety measures to apply for avoiding an unreasonable residual risk. ASIL D is noteworthy, not only because of the elevated risk it represents and the exceptional rigor required in development, but because automotive electrical, electronic, and software suppliers make claims that their products have been certified or otherwise accredited to ASIL D.

SUMMARY OF THE INVENTION

This invention relates to a power supply architecture which incorporates various components and high integrity and diverse monitoring schemes that potentially enable one or more associated control processors to operate under ASIL D standards.

According to one aspect of the invention, a circuit for providing redundant monitoring of an operating voltage V present at a predetermined point in an electrical system comprises a voltage divider, a first monitor, and a second monitor. The voltage divider is connected between the predetermined point and a ground. The voltage divider defines a first intermediate node at a potential V1, that is less than the operating voltage V. The voltage divider further defines a second intermediate node at a potential V2 less than the potential V1. The first monitor is coupled to the first node and is operable to detect a voltage fault or discrepancy in the level of the operating voltage V. The second monitor is coupled to the second node and is operable to detect a voltage fault or discrepancy in the level of the operating voltage V. A protection circuit may be connected between the first intermediate node and the ground for limiting the voltages at the first and second node within a predetermined safe operating range of the first and second monitors. In addition, a third monitor may be coupled to one of the first and second nodes and operable to detect a voltage fault or discrepancy in the level of the operating voltage V. In certain embodiments, each of the monitors is coupled to the respective first or second nodes via a low pass filter.

According to another aspect of the invention, a power supply architecture comprises a first processor, a second processor, a first power supply, and a second power supply. The first power supply is configured to supply a first group of operating voltages to the first processor. At least a portion of the first group of operating voltages is also coupled to monitoring inputs of both the first and second processors. The second power supply is configured to supply a second group of operating voltages to the second processor. At least a portion of the second group of operating voltages is also coupled to monitoring inputs of both the first and second processors. Each of the first and second processors operates to monitor and evaluate the statuses of the portion of the first group of operating voltages and also to determine whether any anomalies are present. Each of the first and second processors operates to monitor and evaluate the statuses of the portion of the second group of operating voltages and also to a determine whether any anomalies are present. In one embodiment, the first processor discretely monitors and evaluates the statuses of the portion of the first group and the second processor discretely monitors and evaluates the statuses of the portion of the second group.

The power supply architecture, above, may also include a third processor and a third power supply. The third power supply is configured to supply a third group of operating voltages to the third processor. At least a portion of the third group of operating voltages is also coupled to monitoring inputs of the third processor. The third processor operates to evaluate the statuses of the portion of the third group and to a determine whether any anomalies are present. In another embodiment, the third processor generates multiple core voltages that are connected to the monitoring inputs of one of the first and second processors. One of the first and second processors may operate to evaluate the statuses of the multiple core voltages and to a determine whether any anomalies are present. In yet another embodiment, an over/under voltage circuit may be coupled to receive the multiple core voltages from the third processor. The over/under circuit is operative to generate digital status signals which in turn are supplied to the monitoring inputs of one of the first and second processors. Additionally, one of the first and second processors is operative to evaluate the statuses of the portion of the digital status signals and to a determine whether any anomalies are present. In another embodiment, the first and second processors may be located on a first circuit board, and the third processor may be located on a second, separate circuit board, and the digital status signal are transmitted therebetween.

According to still another aspect of the invention, a power supply architecture comprises a first processor, a first power supply, and a first control section. The first processor is partitioned into two MPU applications to define a first control section and first monitoring section. The first power supply is configured to supply a first group of operating voltages to the first processor. At least a portion of the first group is coupled to monitoring inputs of the both the first control section and the first monitoring section. The first control section and the first monitoring section are operative to evaluate the statuses of the portion of the first group and to determine whether any anomalies are present. In one embodiment of this power supply architecture, a second processor may be partitioned into two MPU applications to define into a second control section and second monitoring section. A second power supply may be provided for supplying a second group of operating voltages to the second processor. At least a portion of the second group of operating voltages may also be connected to monitoring inputs of the second control section and the second monitoring section. The second control section and second monitoring section are operative to evaluate the statuses of the portion of the second group and to a determine whether any anomalies are present.

According to still yet another aspect of the invention, a power supply architecture comprises a processor, a power management controller (PMC), and first and second voltage regulators. The PMC is operable to supply a group of different operating voltages to the processor. The first voltage regulator connected to supply a voltage V1 to a first input of the PMC. The second voltage regulator is connected to supply a voltage V2 to a second input of the PMC and to a memory associated with the processor. The PMC is operable to generate a delayed enable signal to an enable input of the second voltage regulator such that the memory of the processor is activated with a delay relative to its core voltages.

According to yet another aspect of the invention, a power supply architecture comprises a processor; a power management controller (PMC), and a voltage regulator. The PMC is operable to supply a group of different operating voltages to the processor. The voltage regulator is connected to supply a voltage V1 signal to an input of the PMC. The processor is operative to monitor and evaluate the status of the voltage V1 signal to determine whether an anomaly is present. In one embodiment, the regulator may be a first regulator and may include a second voltage regulator connected to supply a voltage V2 signal to a second input of the PMC. The processor is also operative to monitor and evaluate the status of the voltage V2 to determine whether an anomaly is present. In one embodiment, the V1 and V2 voltage signals may be discretely monitored by the processor. In another embodiment, the at least a portion of the group of operating voltages supplied to the processor may also be coupled to monitoring inputs of the processor. The processor may be operative to evaluate the at least a portion of the group of operating voltages to determine whether an anomaly is present. In yet another embodiment, the at least a portion of the group of operating voltages may be discretely monitored by the processor. In addition, a third voltage regulator for supplying an operating voltage V3 signal to a memory may be associated with the processor. Here, the processor may also monitor the status of the V3 voltage signal to determine whether an anomaly is present.

In yet another embodiment of the power supply architecture, above, the processor may be a first processor that generates an output reference source signal and the power supply architecture may include a second processor that is operative to monitor and evaluate the output reference source signal to determine whether an anomaly is present. Additionally, the output reference source signal of this embodiment may be discretely monitored by the second processor.

According to another aspect of the invention, a power supply architecture comprises a processor, a power management controller (PMC), and a voltage regulator. The PMC is operable to supply a group of different operating voltages to the processor. The voltage regulator is connected to supply an operating voltage to the PMC. The processor is operative to monitor and evaluate at least a portion of the group of operating voltages to determine whether an anomaly is present. In one embodiment, the at least a portion of the group of operating voltages may be discretely monitored by the processor. In another embodiment, the processor is a first processor that generates an output reference source signal and a second processor is provided that is operative to monitor and evaluate the output reference source signal to determine whether an anomaly is present. Here, the output reference source signal may be discretely monitored by the second processor.

In yet another aspect of the invention, a power supply architecture for a vehicle comprises a processor, a first communication bus connected between the processor and a vehicle control system, and a first power supply for supplying a first operating voltage to the first communication bus. A second communication bus is connected between the processor and the vehicle control system. A second power supply, separate from the first power supply, is configured to supply a second operating voltage to the second communication bus.

Various aspects of this invention will become apparent to those skilled in the art from the following detailed description of the preferred embodiment, when read in light of the accompanying drawings.

BRIEF DESCRIPTION OF THE DRAWINGS

FIG. 9b represents an alternate embodiment of FIG. 9a.

DETAILED DESCRIPTION OF THE PREFERRED EMBODIMENTS

This invention concerns various embodiments directed to the efficient distribution and failsafe monitoring of power in a microcontroller system. While the various embodiments are particularly suitable for use in vehicular applications (including both automotive and truck), it will be readily appreciated that the invention and its various embodiments can be used, either singly or collectively, in other control applications having similar operating requirements. In one application, the inventions are used in a Multiple ASIL Optimized Power Supply Architecture for an electronic control module used for supervisory input processing (radar, camera, etc.) and output commands (engine torque, transmission torque, steering angle or torque, brake commands or torque, suspension commands, etc.) for driver assistance systems. The various inventions provide an integrated method or apparatus for an electronic module safety architecture which includes diversity, time and space independence for power supplies for the varied ASIL microprocessors and vehicle communication buses.

Figure 1:
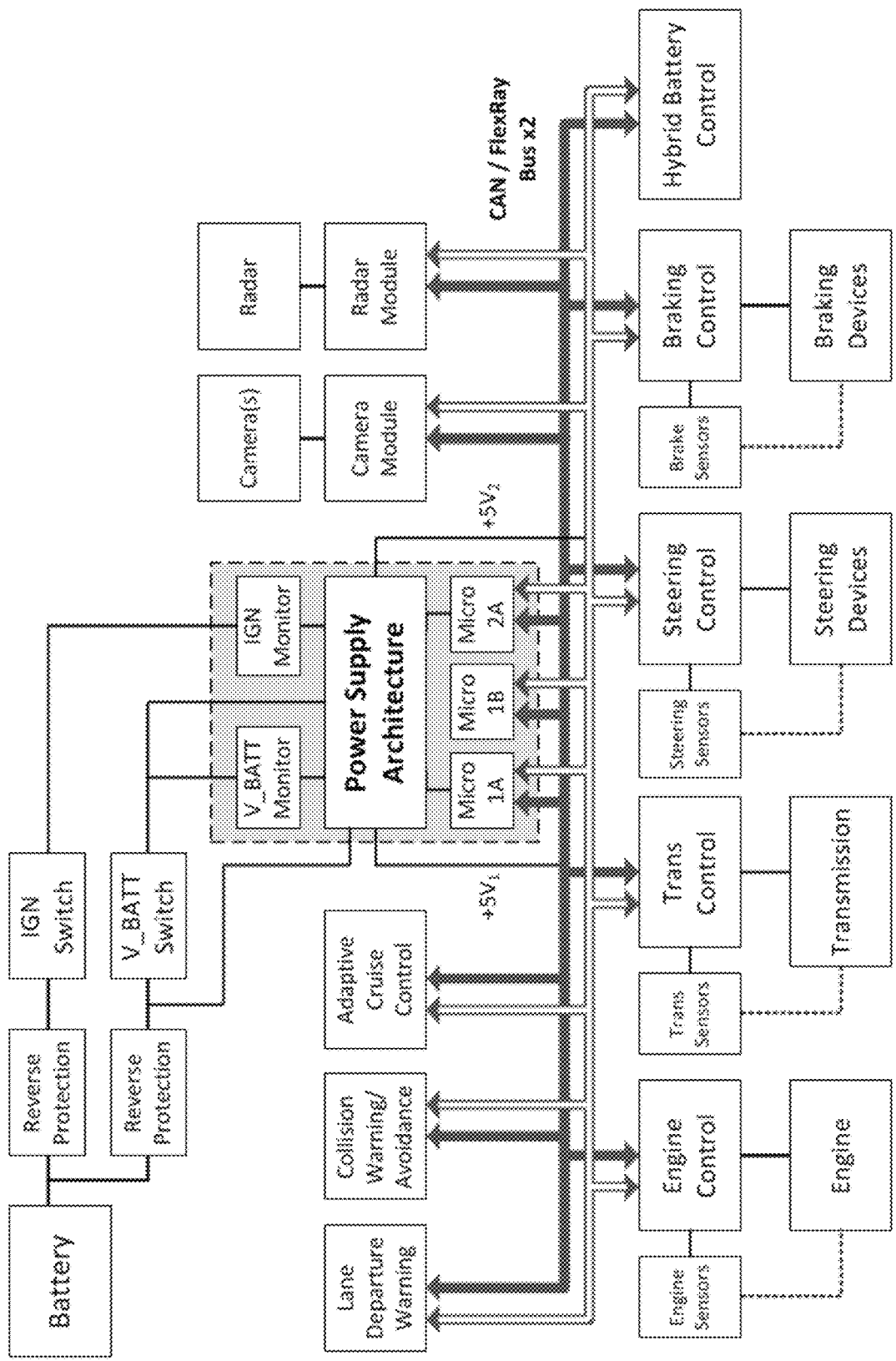
FIG. 1 is a block diagram showing one example of an operating environment for a power supply architecture embodying the principles of the invention, wherein the invention is utilized as a power supply with multiple vehicle control system.
Figure 2:
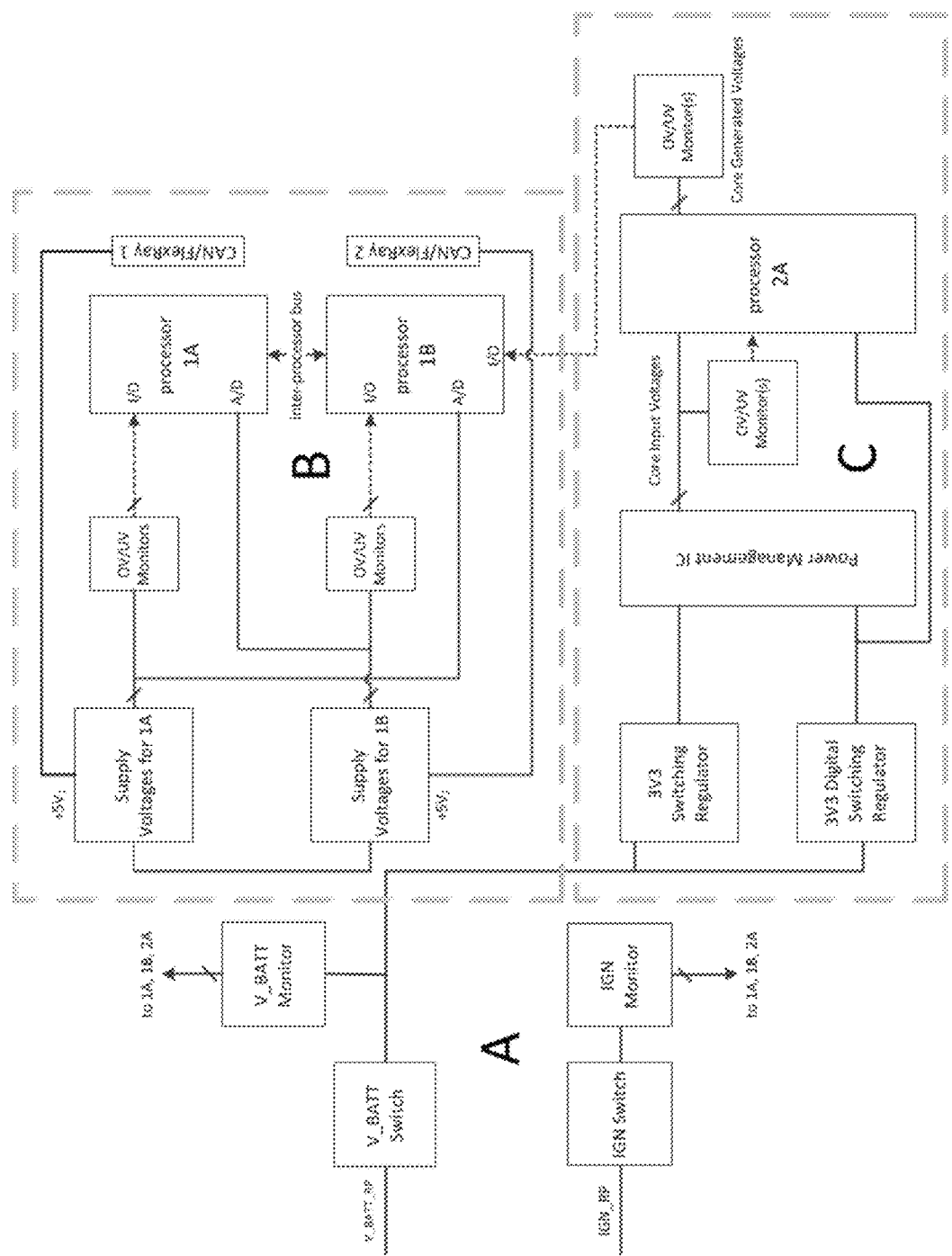
FIG. 2 is a block diagram showing one example of the arrangement of components which comprise the power supply architecture of FIG. 1.

Referring now to the drawings, there is illustrated in FIG. 1 a block diagram showing one example of an operating environment for a power supply architecture embodying the principles of the invention, wherein the invention is utilized as a power supply in a vehicle control system. Generally, referring to FIG. 1, the functional aspects of the Multiple ASIL Optimized Power Supply Architecture of the electronic module may be characterized as follows:

a. includes two high integrity ASIL D compatible microprocessors (1A and 1B) for supervisory input processing and output commands for driver assistance systems.

b. receives the input processing and output command information from two or more pairs of automotive communication buses (CAN, Flexray, etc.). These communication buses transfer high integrity information. Each external bus type has a complementary role if one of them is severed. As shown in FIGS. 1 and 2, each communication bus receives power from a separate and independent power supply.

c. includes one other high throughput processing microprocessor (microprocessor 2A) with external memory. The microprocessor 2A may have a quality management (non-ASIL) hardware requirement. Alternatively, the microprocessor 2A may have a higher level designation, such as ASIL B.

d. microprocessors 1A and 2A may be used predominantly for control and microprocessor 1B may be used predominantly for checking microprocessor 1A and 2A.

e. in one alternative, a minimal set of functions microprocessor 1B is used for control and for these functions microprocessor 1A is used for checking.

f. providing independence between the 2 high integrity Automotive Safety Integrity Level (ASIL D) microprocessors (1A and 1B) and the high throughput processing quality management microprocessor (microprocessor 2A) with ASIL B monitoring for external microprocessor hardware.

The recently approved ISO 26262 safety standards have time and space independence to be achieved for power supplies and their monitoring for the microprocessors and varied vehicle communication buses—CAN, Flexray, etc.

FIG. 2 is a block diagram showing one example of the arrangement of components which comprise the power supply architecture of FIG. 1, including Section A (switched battery and ignition voltage monitoring), Section B (independent power supplies and cross-monitoring between processors 1A and 1B) and Section C (power management controller and processor 2A).

Figure 3:
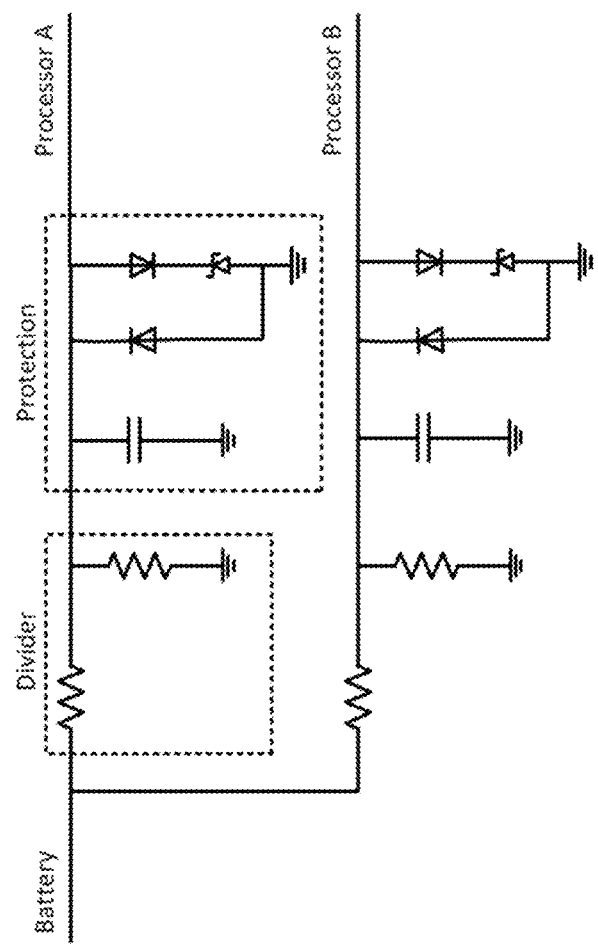
FIG. 3 is a typical prior art circuit for providing redundant monitoring of an operating voltage in an electrical system.

FIG. 3 shows a typical prior art circuit for monitoring the switched battery and ignition voltages across two processors, A and B, embodying the principles of the invention, and which represents Section A of FIG. 2. Switched battery voltage, which in one embodiment may be on the order of 26.5V in an automobile, can be divided down to an acceptable input level for a microprocessor. There may also be protection components in place to protect the processor in the case of over/under voltage transients. Typically, there exists a divider and a protection circuit for every processor that is monitoring the switched battery input.

Figure 4:
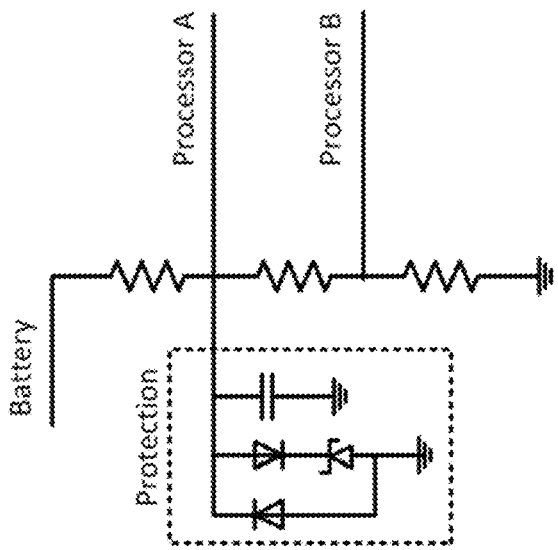
FIG. 4 is a simplified circuit for providing redundant monitoring of an operating voltage in an electrical system, and embodying the principles of the invention.

FIG. 4 represents an embodiment of a circuit for monitoring battery voltages across two or more microprocessors having improved economy and reliability. In case of using two monitoring processors, instead of having two separate voltage dividers, the processors share three dividing resistors. This configuration still divides the voltage to a safe level for the processors, but it also sets up a diverse configuration where the battery voltage translates to different operational voltage ranges for each processor. For example, processor A may read a full battery at 4.5+V, while processor B may read the full battery at 2.5V, invoking algorithmic diversity. Another benefit of this topology is the ability to use one protection circuit, even while using two or more processors. Because the protection circuit is placed at the first intermediate node of the dividing resistors (near Processor A), it will protect any other processors from voltage transients whether they are at that node or below that node.

Figure 5B:
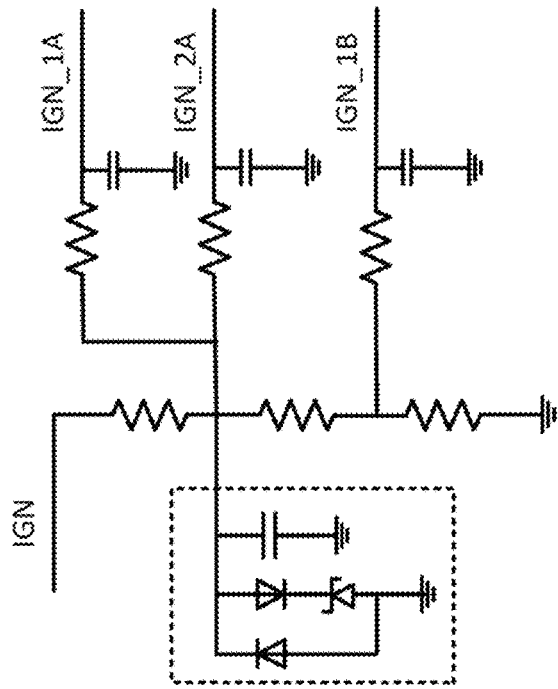
FIGS. 5a and 5b show circuits using the principles of FIG. 4 for monitoring the switched battery and ignition voltages across three processors, 1A, 1B, and 2A, and representing one example of section A of FIG. 2.
Figure 5A:
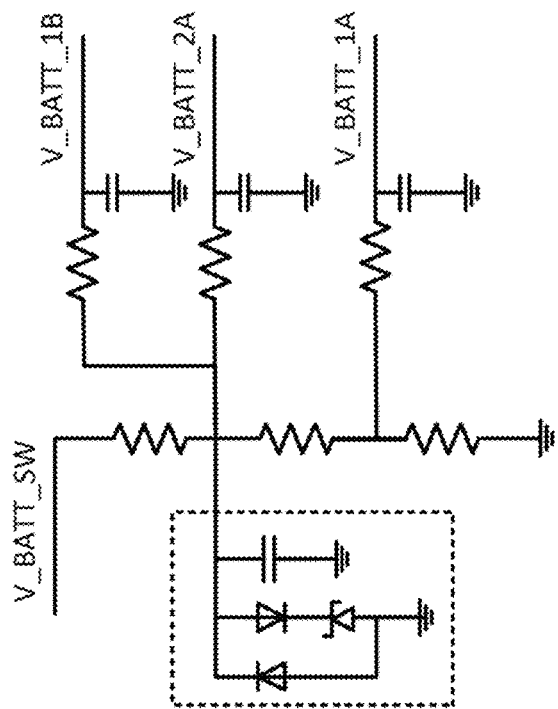

FIG. 5a is the switched battery monitoring topology used by the invention. Similar to FIG. 4, it uses one set of protection components. In addition to FIG. 4, there is a third processor, and two of the processors share an operational voltage range at the first intermediate node on the divider. The resistors leading to each processor isolate the processors from each other, and they can also be incorporated in low-pass filters to reduce noise.

FIG. 5b is an ignition voltage monitoring circuit, using the same topology as FIG. 5a. Certain embodiment of the invention described herein can make use of this cost effective circuit for both the battery and ignition voltages. To add further diversity to the system, the reference points of processor 1A and 1B may be switched between FIG. 5a and FIG. 5b. This allows each processor to have algorithmic diversity within itself, reading battery voltage on one operational range while reading ignition voltage on another. This results in improved failure mode detection.

Figures 6A, 6B:
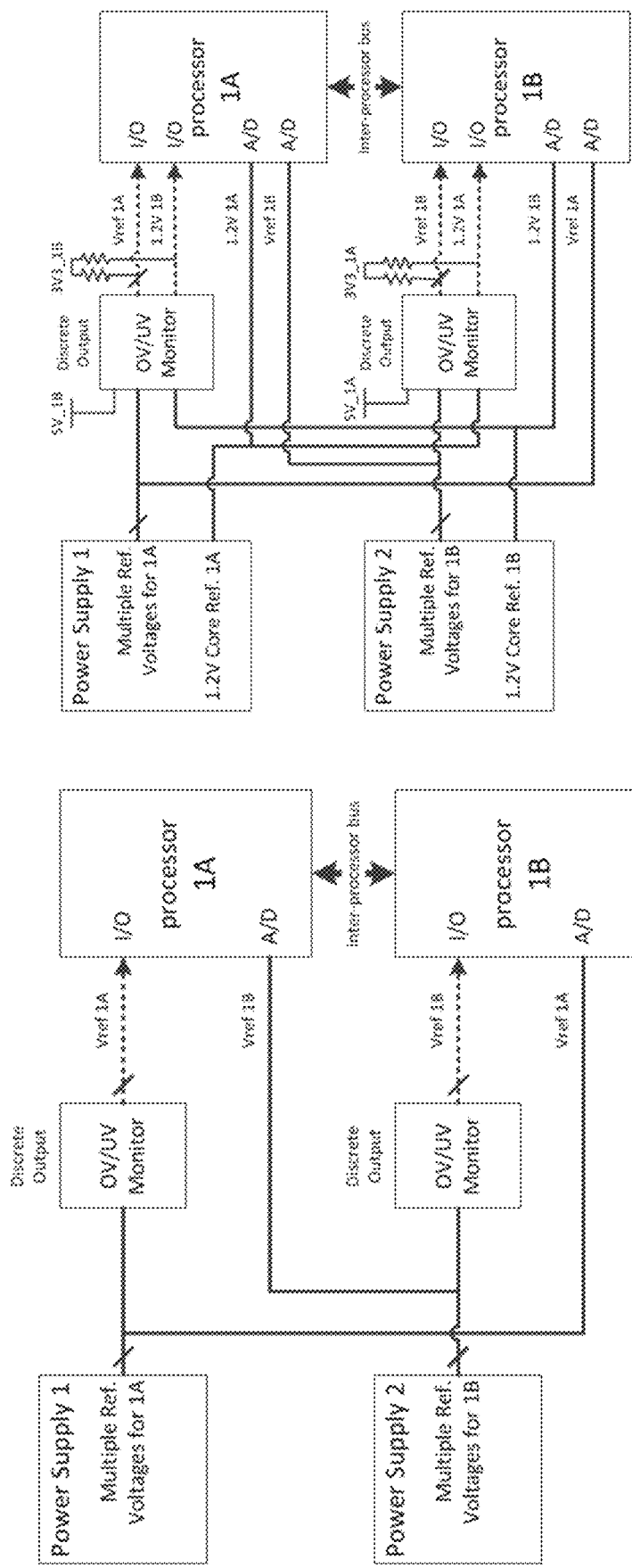
FIG. 6a represents one example of section B of FIG. 2, wherein multiple supply voltages from two independent power supplies are cross-monitored through diverse analog and digital (discrete) methods.
FIG. 6b is similar to FIG. 6a, but showing additional details of the monitoring of a 1.2V core voltage, and wherein the 1.2V core voltage has opposite analog/digital routing than the rest of the outputs from the respective power supply.

FIG. 6a represents section B of FIG. 2, wherein multiple supply voltages from two independent power supplies are cross-monitored through diverse analog and discrete methods across two processors. For the sake of clarity, it should be noted that the physical power supply inputs to the processors, which provide operational voltages rather than monitored voltages, are not shown in FIGS. 6a-9b. The illustrated lines represent the monitored reference voltages of these supply voltages, and no significant power is consumed through these illustrated reference lines. In FIG. 6a, a group of reference voltages for processor 1A are monitored through analog-to-digital (A/D) inputs on a second processor 1B. Simultaneously, the same voltages are sent to one or several overvoltage/undervoltage (OV/UV) monitor(s), which calculate discrete pass/fail outputs depending on the state of the power supplies. Processor 1A reads these outputs using digital (I/O) pins. Processor 1B uses precisely the same method, monitoring its own supply through OV/UV monitor(s) and monitoring 1A's supply through its A/D inputs. This embodiment incorporates time and space diversity, where the independent power supplies are monitored by two processors, both using analog (A/D) and discrete (I/O) methods.

FIG. 6b is similar to FIG. 6a but shows additional details of the circuit. In FIG. 6b, a 1.2V core reference voltage is separated from the rest of the referenced voltage in order to show that it is monitored in an opposite fashion. The same time and space diversity exists for the 1.2V reference, but it is monitored as an analog signal by its own processor and by a digital (or discrete) signal for the other processor. In one embodiment, the processor monitors its own 1.2V core with a direct analog connection to respond quickly to a failure, thus minimizing or eliminating a delay that could come from the inter-processor bus. Another additional detail in FIG. 6b is the specified supply and pull-up voltages for the OV/UV monitors. This applies to all OV/UV blocks in FIGS. 6a,b; 7a,b; and 8a,b. The discrete monitors used by 1A uses voltages from power supply 2, and the discrete monitors used by 1B uses voltages from power supply 1. This allows the cross monitoring system to operate in a situation where one of the power supplies fails completely.

Figures 7A, 7B:
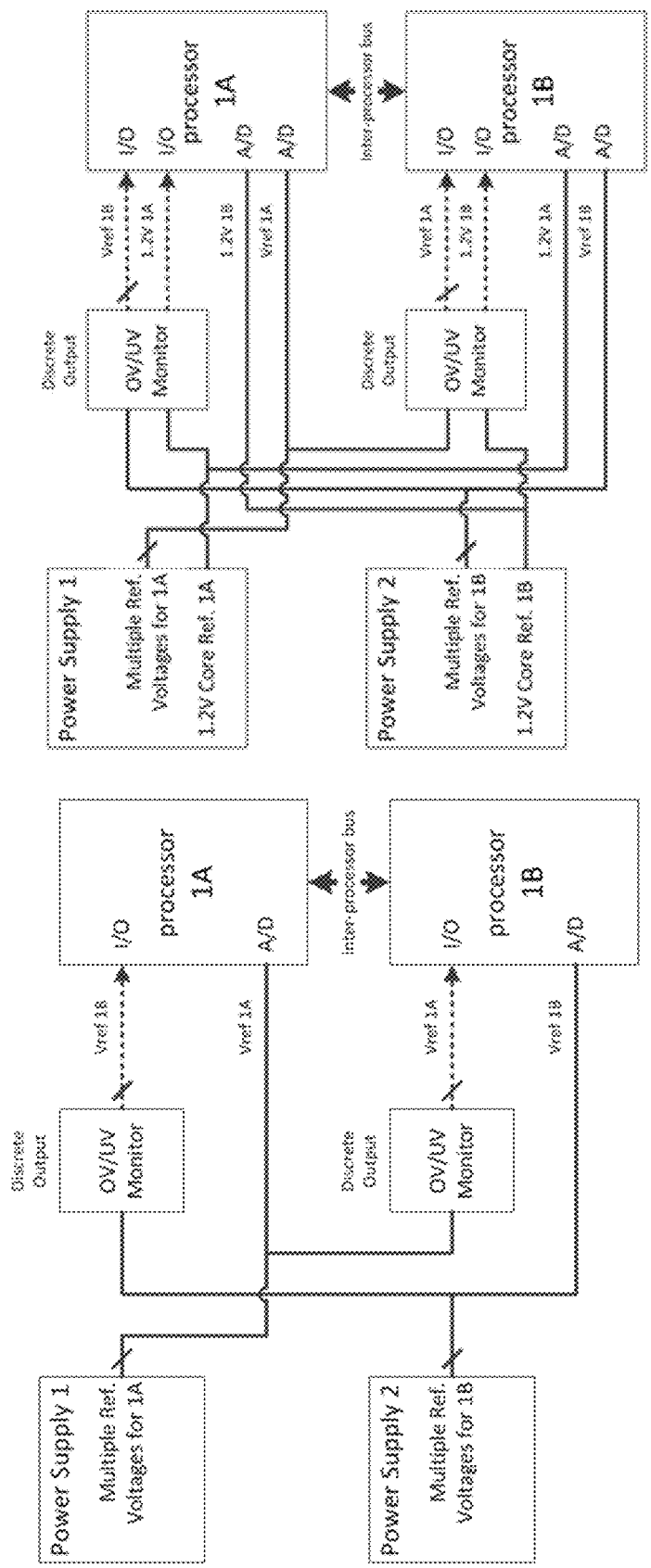
FIG. 7a represents an alternate embodiment of FIG. 6a (Section B of FIG. 2), wherein the analog and digital routing is switched.
FIG. 7b represents an alternate embodiment of FIG. 6b, wherein the analog and digital routing is switched.

FIG. 7a is very similar to FIG. 6a, except that all assignments of analog and digital paths have been swapped between the supplies. Each processor now monitors its own reference voltages using analog means and the other processor's voltages through discrete means.

FIG. 7b is very similar to FIG. 7a, but includes an inverted method of monitoring the 1.2V core voltages. A similar embodiment was previously described in FIG. 6b. However, the embodiment of FIG. 6b may represent certain advantages over the embodiment of FIG. 7b.

Figure 8B:
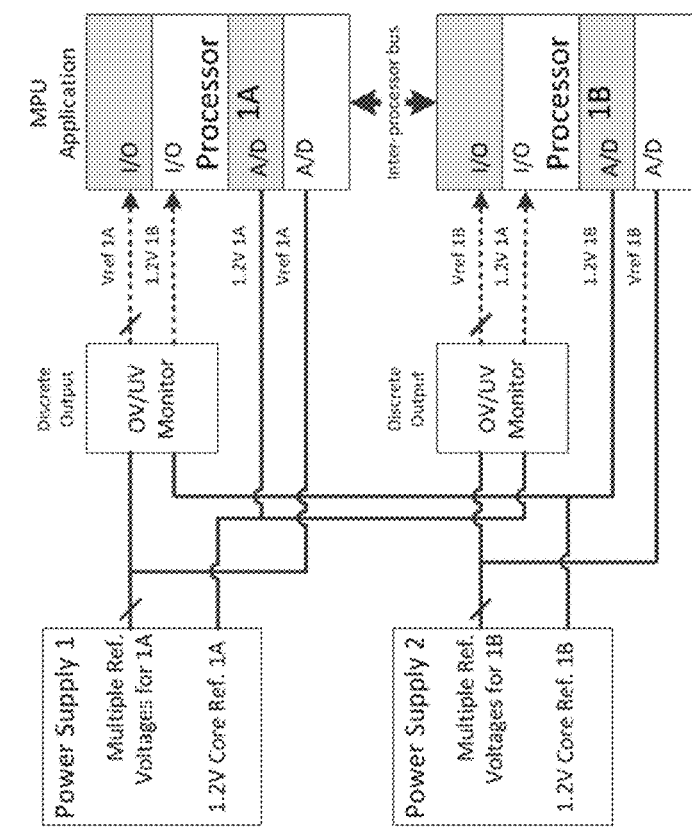
FIGS. 8a and 8b represent alternate embodiments of FIG. 6a (Section B of FIG. 2), wherein each microprocessor 1A and 2A is partitioned into two MPU applications, which enables each microprocessor to check itself (including its own 1.2V core voltage), without memory corruption.
Figure 8A:
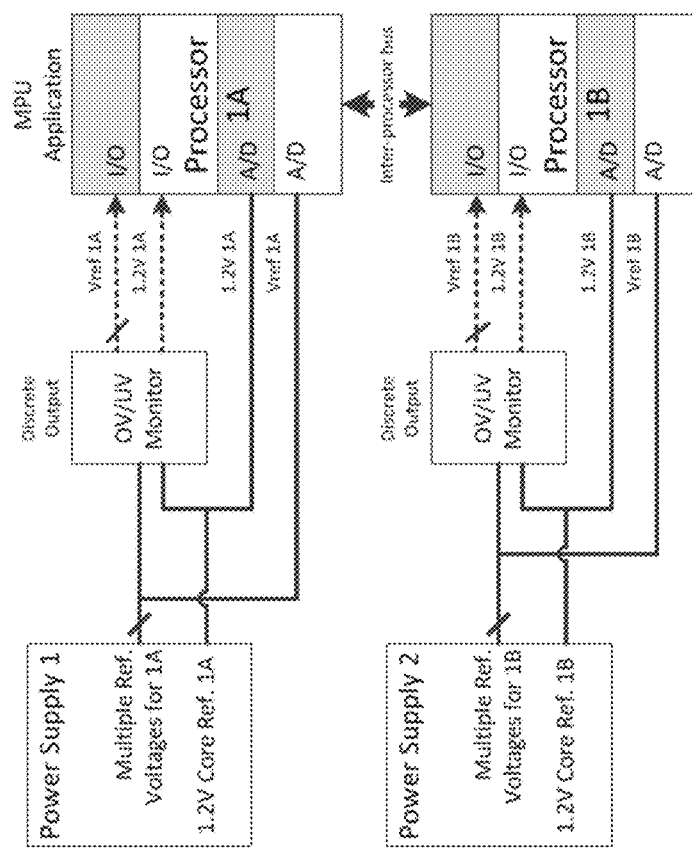

FIG. 8a represents an alternate embodiment of the invention. Some processors have the ability to run memory partition units, where partitions of the memory are separated, or otherwise segregated, in such a way that they cannot corrupt other partitions. This opens up the possibility of using one microprocessor to represent two microprocessors. FIG. 8a is a simplified memory partition unit application. Power supply voltages do not cross from one processor to the other. However, they are diversely monitored by two distinct partitions in each processor, which are represented by the shaded portions of the processor blocks (grey and white).

FIG. 8b represents an alternate embodiment of FIG. 8a, where the 1.2V core voltage is cross-monitored between processors, while the rest of the voltages are cross-monitored between partitions in their respected processor. In certain environments, FIG. 8a may be a preferred arrangement because the same level of diversity can be accomplished as FIG. 8b without transferring delayed monitor signals on an inter-processor bus.

Figure 9A:
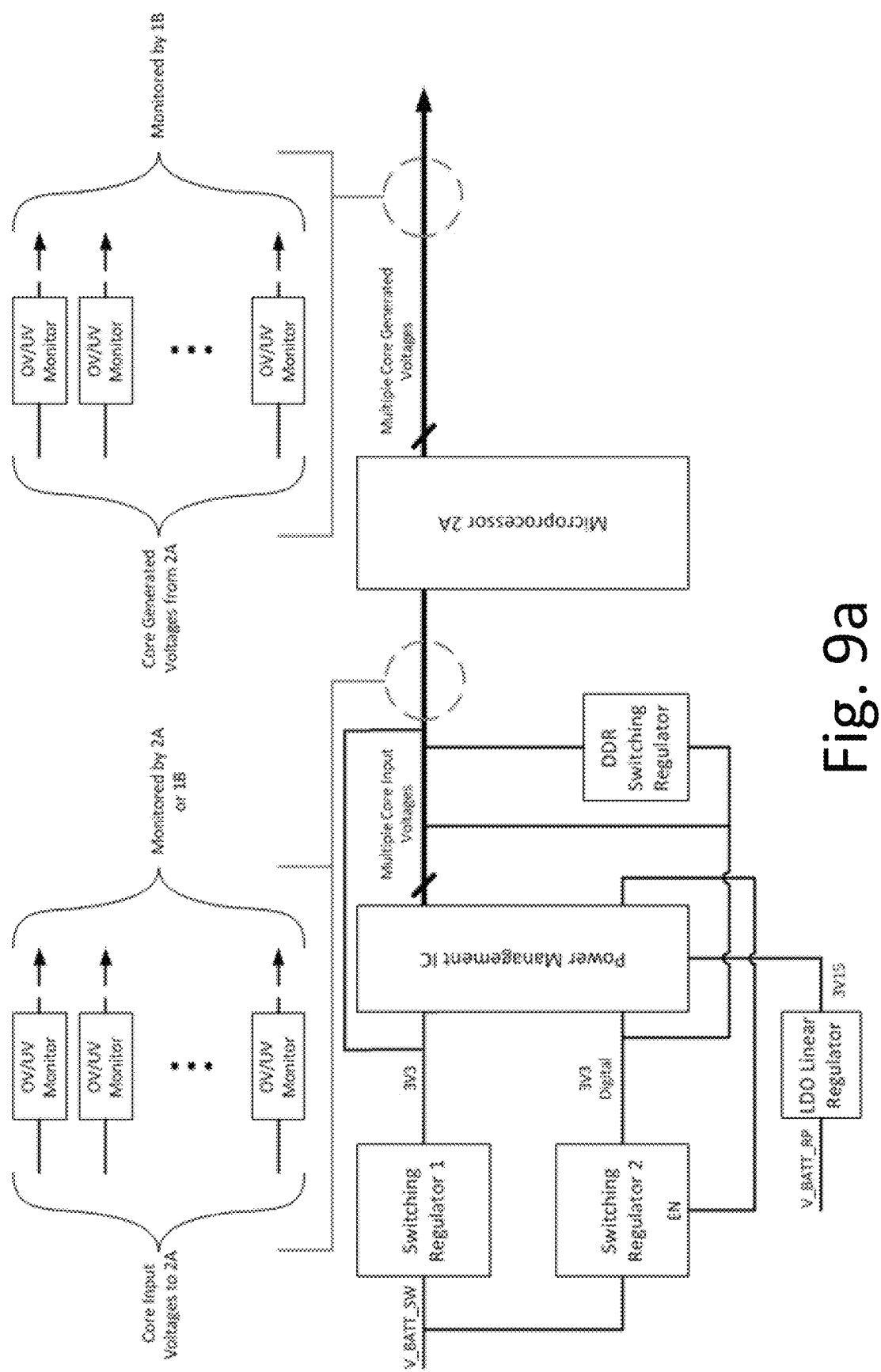
FIG. 9a represents one example of section C of FIG. 2.

FIG. 9a represents section C of FIG. 2 and includes the function and monitoring of microprocessor 2A. A power management controller (PMC) provides the necessary core and peripheral voltages for 2A. Two switching regulators provide power to the PMC. Regulator 1 turns on with a signal from V_BATT_SW, and the essential supplies are provided to 2A. Some peripherals, such as DDR memory may require that their power supplies be turned on after the processor's core power supplies. To accomplish this, a naturally delayed output from the PMC enables Regulator 2, which powers up a dedicated regulator for the high-current DDR memory. The power supply voltages for processor 2A are monitored only with a discrete method, and 2A does not include A/D converters. Because 2A is located on a separate printed circuit board (PCB) than 1A and 1B, discrete signals are preferred for their immunity to noise, which could affect analog signals. It is also preferred to limit the number of signals that must be passed from one PCB to the other. For this reason, voltages that are not generated in 2A are monitored by individual OV/UV monitors and read by 2A. Examples include core input voltages and memory DDR memory voltages. Processor 2A generates operational voltages for its cores, as well as several peripheral voltages. These voltages are monitored by individual OV/UV processors and read by processor 1B, located on a separate PCB.

Figure 9B:
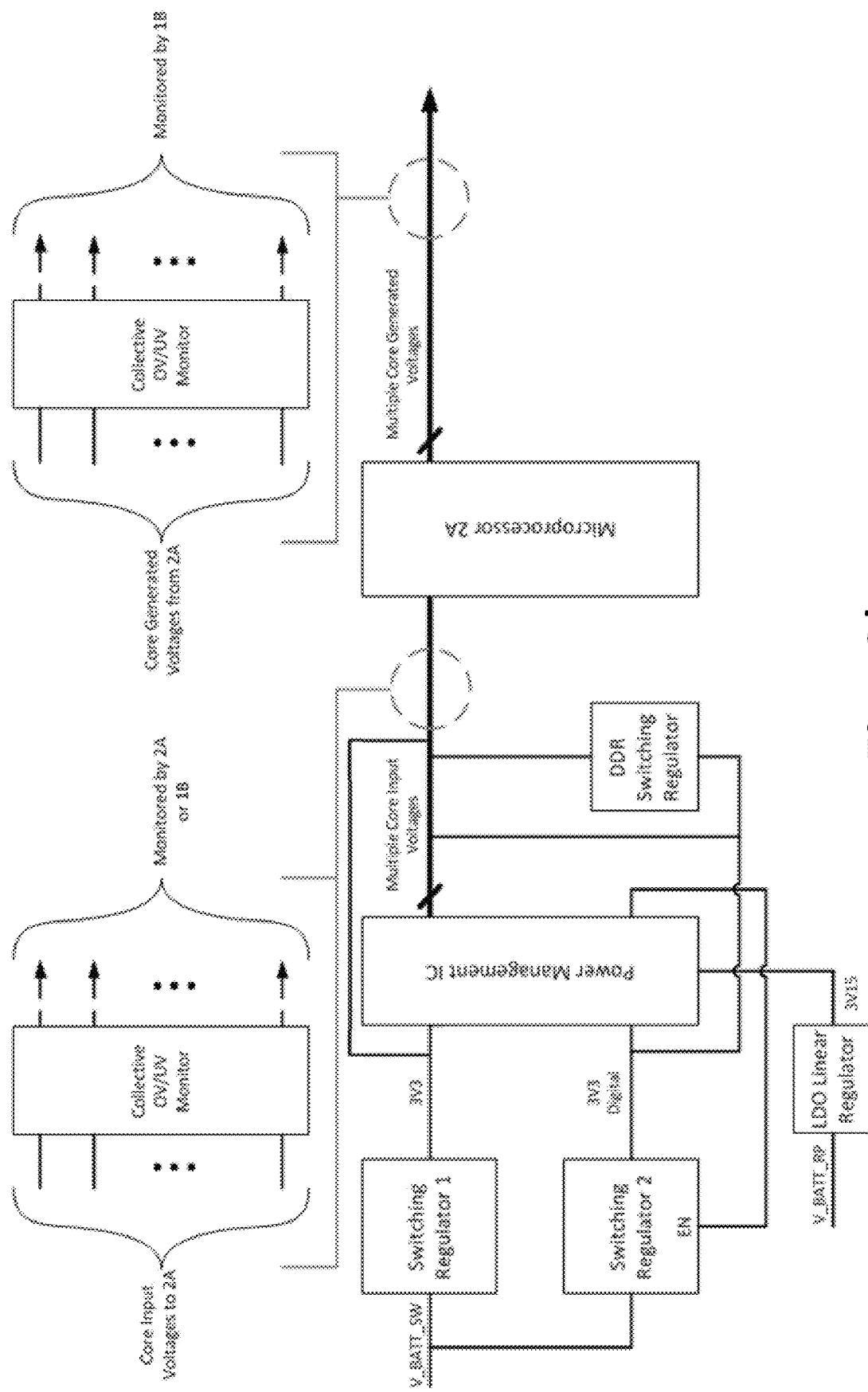

FIG. 9b is very similar to FIG. 9a, except that the OV/UV monitors no longer exist as individual modules for each supply voltage. Instead, they are grouped into collective monitors, which generate one or more discrete outputs based on the status of several input voltages. Collective as well as individual voltage monitors should be considered for the embodiment of section C. If packaging requirements allow for additional signals to be transferred between PCBs, processor 1B could discretely monitor all the supply voltages in section C, which is another embodiment to consider.

The principle and mode of operation of this invention have been explained and illustrated in its preferred embodiment. However, it must be understood that this invention may be practiced otherwise than as specifically explained and illustrated without departing from its spirit or scope.

What is claimed is:

1. A circuit for providing redundant monitoring of an operating voltage V present at a predetermined point in an electrical system, the circuit comprising:
   a voltage divider comprising three dividing resistors connected between the predetermined point and a ground, the voltage divider defining a first intermediate node at a potential V1 less than the operating voltage V and a second intermediate node at a potential V2 less than the potential V1;
   a first monitor coupled to the first node and operable to detect a voltage fault or discrepancy in the level of the operating voltage V;
   a second monitor coupled to the second node and operable to detect a voltage fault or discrepancy in the level of the operating voltage V; and
   a third monitor coupled to one of the first and second nodes and operable to detect a voltage fault or discrepancy in the level of the operating voltage V.

2. The circuit according to claim 1 and further including a protection circuit connected between the first intermediate node and the ground for limiting the voltages at the first and second node within a predetermined safe operating range of the first and second monitors.

3. The circuit according to claim 1 wherein each of the monitors is coupled to the respective first or second nodes via a low pass filter.

4. A power supply architecture comprising the circuit of claim 1 and further comprising:
   a first processor partitioned into two memory partition unit (MPU) applications to define a first control section and first monitoring section;
   a first power supply for supplying a first group of operating voltages to the first processor, at least a portion of the first group coupled to monitoring inputs of the both the first control section and the first monitoring section; and the first control section and the first monitoring section operative to evaluate the statuses of the portion of the first group and to determine whether any anomalies are present.

5. A power supply architecture according to claim 4 comprising:
- a second processor partitioned into two MPU applications to define a second control section and second monitoring section;
- a second power supply for supplying a second group of operating voltages to the second processor, at least a portion of the second group also connected to monitoring inputs of the second control section and the second monitoring section; and
- the second control section and second monitoring section operative to evaluate the statuses of the portion of the second group and to a determine whether any anomalies are present.

6. A power supply architecture comprising the circuit of claim 1 and further comprising:
- a processor;
- a power management controller (PMC) operable to supply a group of different operating voltages to the processor;
- a first voltage regulator connected to supply a voltage V1 to a first input of the PMC;
- a second voltage regulator connected to supply a voltage V2 to a second input of
- the PMC and to a memory associated with the processor;
- the PMC operable to generating a delayed enable signal to an enable input of the second voltage regulator such that the memory of the processor is activated with a delay relative to its core voltages.

7. A power supply architecture comprising the circuit of claim 1 and further comprising:
- a processor;
- a power management controller (PMC) operable to supply a group of different operating voltages to the processor;
- a voltage regulator connected to supply a voltage V1 signal to an input of the PMC; and
- the processor is operative to monitor and evaluate the status of the voltage V1 signal to determine whether an anomaly is present.

8. The power supply architecture according to claim 7 wherein the regulator is a first regulator and including a second voltage regulator connected to supply a voltage V2 signal to a second input of the PMC, and wherein the processor is also operative to monitor and evaluate the status of the voltage V2 to determine whether an anomaly is present.

9. The power supply architecture according to claim 8 wherein the V1 and V2 voltage signals are discretely monitored by the processor.

10. The power supply architecture according to claim 7 wherein the at least a portion of the group of operating voltages supplied to the processor are also coupled to monitoring inputs of the processor, and wherein the processor is operative to evaluate the at least a portion of the group of operating voltages to determine whether an anomaly is present.

11. The power supply architecture according to claim 7 wherein the at least a portion of the group of operating voltages are discretely monitored by the processor.

12. The power supply architecture according to claim 8 and further including a third voltage regulator for supplying an operating voltage V3 signal to a memory associated with the processor, and wherein the processor monitors the status of the V3 voltage signal to determine whether an anomaly is present.

13. The power supply architecture according to claim 7 wherein the processor is a first processor that generates an output reference source signal and including a second processor, and wherein the second processor is operative to monitor and evaluate the output reference source signal to determine whether an anomaly is present.

14. The power supply architecture according to claim 12 wherein the output reference source signal is discretely monitored by the second processor.

15. A power supply architecture comprising the circuit of claim 1 and further comprising:
- a processor;
- a power management controller (PMC) operable to supply a group of different operating voltages to the processor;
- a voltage regulator connected to supply an operating voltage to the PMC; and
- the processor is operative to monitor and evaluate at least a portion of the group of operating voltages to determine whether an anomaly is present.

16. The power supply architecture according to claim 15 wherein the at least a portion of the group of operating voltages is discretely monitored by the processor.

17. The power supply architecture according to claim 15 wherein the processor is a first processor that generates an output reference source signal and including a second processor, and wherein the second processor is operative to monitor and evaluate the output reference source signal to determine whether an anomaly is present.

18. The power supply architecture according to claim 17 wherein the output reference source signal is discretely monitored by the second processor.

19. A power supply architecture for a vehicle comprising the circuit of claim 1 and further comprising:
- a processor;
- a first communication bus connected between the processor and a vehicle control system;
- a first power supply for supplying a first operating voltage to the first communication bus;
- a second communication bus connected between the processor and the vehicle control system; and
- a second power supply separate from the first power supply for supplying a second operating voltage to the second communication bus.

20. A power supply architecture comprising:
- a first processor;
- a second processor;
- a first power supply for supplying a first group of operating voltages to the first processor, at least a portion of the first group also coupled to monitoring inputs of both the first and second processors;
- a second power supply for supplying a second group of operating voltages to the second processor, at least a portion of the second group also coupled to monitoring inputs of both the first and second processors;
- each of the first and second processors operates to monitor and evaluate the statuses of the portion of the first group and to determine whether any anomalies are present;
- each of the first and second processors operates to monitor and evaluate the statuses of the portion of the second group and to a determine whether any anomalies are present; and
- and wherein the first processor discretely monitors and evaluates the statuses of the portion of the first group and wherein the second processor discretely monitors and evaluates the statuses of the portion of the second group.

21. The power supply architecture according to claim 20 and further including:
a third processor;
a third power supply for supplying a third group of operating voltages to the third processor, at least a portion of the third group also coupled to monitoring inputs of the third processor; and
the third processor operates to evaluate the statuses of the portion of the third group and to a determine whether any anomalies are present.

22. The power supply architecture according to claim 21 wherein the third processor generates multiple core voltages that are connected to the monitoring inputs of one of the first and second processors, and wherein the one of the first and second processors operates to evaluate the statuses of the multiple core voltages and to a determine whether any anomalies are present.

23. The power supply architecture according to claim 22 and further including an over/under voltage circuit coupled to receive the multiple core voltages from the third processor, and operative to generate digital status signals which in turn are supplied to the monitoring inputs of one of the first and second processors, and wherein the one of the first and second processors is operative to evaluate the statuses of the portion of the digital status signals and to a determine whether any anomalies are present.

24. The power supply architecture according to claim 23 wherein the first and second processors are located on a first circuit board, and the third processor is located on a second, separate circuit board, and the digital status signal are transmitted therebetween.

25. The power supply architecture according to claim 20:
wherein the first processor is partitioned into two memory partition unit (MPU) applications to define a first control section and first monitoring section; and further including:
a first power supply for supplying a first group of operating voltages to the first processor, at least a portion of the first group coupled to monitoring inputs of the both the first control section and the first monitoring section; and
the first control section and the first monitoring section operative to evaluate the statuses of the portion of the first group and to determine whether any anomalies are present.

* * * * *